United States Patent
Fried

(10) Patent No.: US 8,085,053 B2
(45) Date of Patent: Dec. 27, 2011

(54) TWISTED-PAIR ELECTRICAL CABLE TESTING

(75) Inventor: Shlomo Fried, Zichron Ya'acov (IL)

(73) Assignee: Biosense Webster, Inc., Diamond Bar, CA (US)

(*) Notice: Subject to any disclaimer, the term of this patent is extended or adjusted under 35 U.S.C. 154(b) by 558 days.

(21) Appl. No.: 12/342,638

(22) Filed: Dec. 23, 2008

(65) Prior Publication Data

US 2010/0156431 A1 Jun. 24, 2010

(51) Int. Cl.
G01R 31/08 (2006.01)
G01R 31/02 (2006.01)

(52) U.S. Cl. .................................... 324/513; 324/539

(58) Field of Classification Search ............... 324/513, 324/527, 528, 530, 531, 539, 541, 543, 551, 324/555
See application file for complete search history.

(56) References Cited

U.S. PATENT DOCUMENTS

| 3,628,133 | A |   | 12/1971 | Dornberger |
| 3,763,426 | A |   | 10/1973 | Wilkes |
| 4,241,304 | A |   | 12/1980 | Clinton |
| 5,050,093 | A |   | 9/1991 | Reddy et al. |
| 5,198,765 | A | * | 3/1993 | Van Der Walt ............... 324/227 |

FOREIGN PATENT DOCUMENTS

FR 2710156 A1 * 3/1995

* cited by examiner

Primary Examiner — Melissa Koval
Assistant Examiner — Daniel Miller
(74) Attorney, Agent, or Firm — Louis J. Capezzuto

(57) ABSTRACT

Methods and systems for cable inspection operate by generating a relative motion between an electrical cable including multiple wires and a magnetic field. An electrical signal induced in the wires is measured responsively to the magnetic field. A variation in the electrical signal is sensed due to the relative motion. In response to the variation, a defect is detected in the electrical cable.

7 Claims, 2 Drawing Sheets

TWISTED-PAIR ELECTRICAL CABLE TESTING

FIELD OF THE INVENTION

The present invention relates generally to cable inspection, and specifically to inspection of twisted-pair electrical cable.

BACKGROUND OF THE INVENTION

Wire manufacturers typically produce electrical wire in long, continuous lengths. The wire is normally wound on spools for sale to wire suppliers or customers. It is not uncommon for wire to break during the wire manufacturing process. When this occurs, the manufacturer usually splices the wire back together and the manufacturing process continues. When the breakage of an insulated electrical wire occurs, the manufacturer usually trims back the insulation on either side of the break and welds the two ends of the conductor together. Since it is not uncommon for several breaks to occur during a given production run, there may be several splices on a particular spool of wire, especially a spool containing several thousand feet of wire. Wire splices may also occur during insulation application, and may be caused by extrusion or tape wrapping.

Twisted-pair cabling is a form of wiring in which two conductors, or two halves of a single circuit, are wound together for the purposes of canceling out electromagnetic interference from external sources. Twisting wires decreases interference since the loop area between the wires, which determines the magnetic coupling into the signal, is reduced. In balanced pair operation, the two wires typically carry equal and opposite signals, which are combined at the destination. Electromagnetic radiations of the wires mutually interfere and are canceled since they are 180 degrees out of phase.

SUMMARY OF THE INVENTION

In a disclosed embodiment, a method is provided for cable inspection, including generating a relative motion between an electrical cable including multiple wires and a magnetic field. An electrical signal induced in the wires is sensed and measured responsively to a magnetic field when relative motion occurs between the wire and the coil. Variations in the electrical signal are detected, wherein the variations correspond to defects in the cable.

There is further provided, according to an embodiment of the present invention, an apparatus for cable inspection, including:
 a magnetic field generator to produce a magnetic field; and
 a monitor coupled to an electrical cable including multiple wires, the monitor being configured to detect variations in electrical signals that are produced responsively to a relative motion between the magnetic field and the electrical cable, wherein the variations correspond to defects in the cable.

There is further provided, according to an embodiment of the present invention, an apparatus for cable inspection, including:
 a magnetic field generator to produce a magnetic field;
 a conveyor for generating a relative motion between an electrical cable including multiple wires and the magnetic field; and
 a monitor coupled to the electrical cable, the monitor being configured to detect variations in electrical signals that are produced responsively to the relative motion, wherein the variations correspond to defects in the cable.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein.

DETAILED DESCRIPTION OF THE INVENTION

Figure 1:
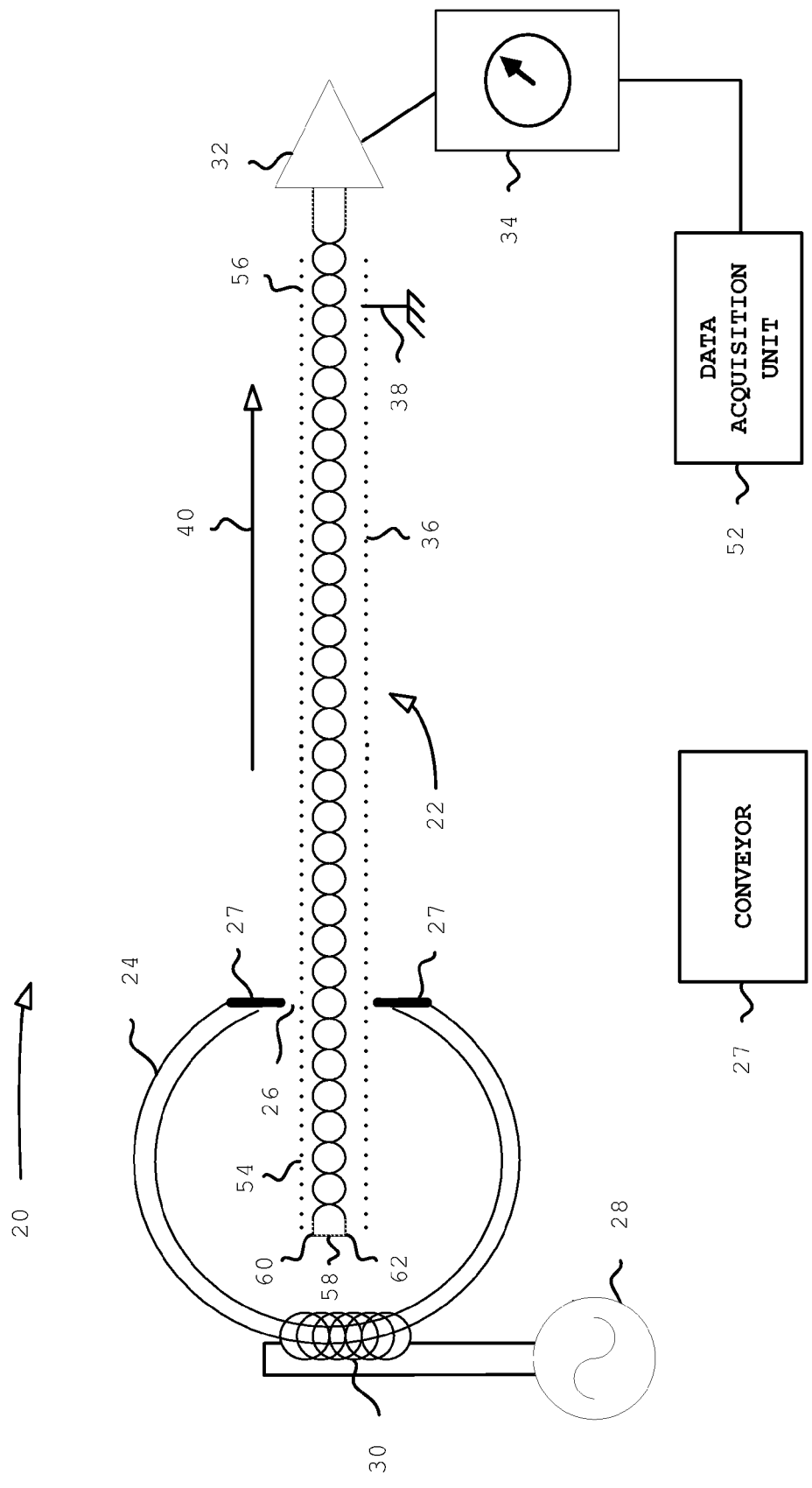
FIG. 1 is a block diagram that schematically illustrates a system for inspecting twisted-pair electrical cable, in accordance with an embodiment of the present invention.

Embodiments of the present invention that are described hereinbelow provide improved methods, products and systems for inspecting twisted-pair electrical cable. In the past, evaluation of twisted-pair electrical cable was typically performed in a destructive manner, by unraveling the cable from its shield, isolating individual pairs of twisted wires within the cable, and then counting the twists, in some cases using a microscope. Historically, an X-ray machine with a needle-hole anode has also been used to image twisted pairs of electrical wires within cables, but has typically been unable to display clear images of the wires due to screening of the wires by the shield and by the presence of multiple pairs of twisted wires.

In embodiments of the invention, a magnetic field generator produces a concentrated magnetic field. For example a ferromagnetic torus with a gap may be driven by an excitation coil to generate a concentrated magnetic field in the gap. A power generator provides alternating current through an excitation coil to generate a magnetic field focus in the torus. The edges of the torus adjacent to the gap may be sharpened to give enhanced concentration of the lines of flux. Alternatively, other types of magnetic field generators may be used for this purpose.

Twisted-pair electrical cable comprising multiple wires is conveyed along a path through the magnetic field focus, via the gap in the torus, for example. That is to say, a relative motion is generated between the cable and the magnetic field. The cable may be conveyed using an automated conveyor or may be pulled through the gap manually, and is thus subjected to the magnetic field. The wires of the cable are typically connected across a differential amplifier at the end of the cable, in order to amplify the differential electrical signal that is generated between the wires due to the effect of the magnetic field.

A monitor, such as an oscilloscope, is connected to the amplifier and is used to measure an electrical signal such as the net voltage induced between paired wires in the cable. The particular instrumentation disclosed herein is not critical, and many known monitors are suitable for continually measuring the electrical signal between the wires. Each paired half-twist of wires behaves as a loop antenna, and produces a voltage whose phase is opposite to that of its fellow when subjected to the magnetic field. That is to say, in a homogeneous magnetic field, the respective voltages of the paired wires normally cancel each other, producing no net voltage across the two wires. As the cable is pulled through the sharply focused field of the test apparatus described above, however, the monitor senses a variation in the electrical signal due to the motion, in phase with the excitation current.

Standard twisted-pair electrical cable normally has a uniform pitch, and the voltage signal detected by the monitor should therefore have uniform amplitude and phase. However, if the twists in the cable are incorrectly spread in a non-uniform fashion at some location in the cable, the electrical signal varies from a norm as the cable is conveyed through the magnetic field. The monitor detects this variation, which is thereupon interpreted as a defect of the twisted-pair electrical cable. A data acquisition unit may be connected to the monitor to automatically report the electrical signal and the detection of the defect.

Defects in twisted-pair electrical cable may be caused when the twists are unraveled during the process of shielding encapsulation. Another cause of defects is that manufacturers of twisted-pair electrical cable typically twist the bundle of paired wires in the opposite direction of the twists of the individual wire pairs. Twisting in this fashion may unravel an individual pair of wires, thus causing the effective number of twists per inch to decrease.

Reference is now made to FIG. 1, which is a block diagram that schematically illustrates a system 20 for inspecting twisted-pair electrical cable, in accordance with an embodiment of the present invention. System 20 comprises a twisted-pair electrical cable 22, a ferromagnetic torus 24, a differential amplifier 34, and a voltage monitor 36. Twisted-pair electrical cable 22 comprises pairs of electrically conductive cable, wound together over the length of the cable, and coated with a shield 38. A current embodiment of system 20 operates effectively as long as shield 38 is not ferromagnetic. (In the case of a shield that is magnetically hardened, system 20 is typically more effective if the shield is first removed). Twisted-pair electrical cable 22 is typically grounded by a chassis 40.

A magnetic field is concentrated in a gap in torus 24 by an exciting coil 32 powered by a power generator 30, producing a magnetic field focus 26. The edges of torus 24 may be sharpened to provide enhanced concentration of the flux lines. That is to say, a magnetic field is concentrated in a location, herein magnetic field focus 26, which is associated with a magnetic field generator. Operating the magnetic field generator produces the magnetic field.

Twisted-pair electrical cable 22, comprising multiple wires 62, 64, has a trailing end 56, and a leading end 58. Trailing end 56 and leading end 58 are labels of twisted-pair electrical cable 22 that are assigned arbitrarily in order to denote opposite ends of the cable. Trailing end 56 of twisted-pair electrical cable 22 is "shorted," i.e., it is stripped of shield 38 and wires 62 and 64 are connected together. Leading end 58 of twisted-pair electrical cable 22 is connected to amplifier 34, completing a circuit for the purpose of monitoring the magnetic field by monitor 36.

A suitable conveyance device, shown schematically as a conveyor 27, moves twisted-pair electrical cable 22 through magnetic field focus 26, guided by diamagnetic shoulders 28. Diamagnetic shoulders 28 are typically made of a plastic material and guide twisted-pair electrical cable 22 precisely through magnetic field focus 26. In an alternative to employing the conveyance device to move twisted-pair electrical cable 22, the cable may be conveyed manually, e.g., by a person rather than by a machine, through magnetic field focus 26. It will be understood, however, that operation of embodiments of the present invention is not limited to a particular method of generating a relative motion between twisted-pair electrical cable 22 and magnetic field focus 26, and that any other suitable method that accomplishes relative motion of twisted-pair electrical cable 22 with respect to magnetic field focus 26 may be used. For example, a movable torus could be conveyed along the cable to achieve the relative motion. An arrow 42 displays a direction of the movement of twisted-pair electrical cable 22. Twisted-pair electrical cable 22 is shown moving in the direction displayed by arrow 42, although embodiments of the present invention are not limited to movement in that direction.

Monitor 36 measures an electrical signal that is induced in the wires of twisted-pair electrical cable 22 in response to relative motion between twisted-pair electrical cable 22 and magnetic field focus 26 and any signal variations thereof. A data acquisition unit 54 may be connected to monitor 36. Data acquisition unit 54 correlates the momentary electrical signal with locations in the electrical cable 22, and interprets certain signal variations in the monitored signal as location-specific defects in twisted-pair electrical cable 22. For example, detection of a signal variation may locate a flaw in a particular twist of the wires of twisted-pair electrical cable 22. Data acquisition unit 54 may report the defect and may also store data delineating the location of a defective part of twisted-pair electrical cable 22. Alternatively, any suitable method known in the art may be used to detect signal variations and to report defects. In the context of the present patent application and in the claims, the term "signal variation" refers to a change (typically an increase) in the amplitude of the monitored signal or to a change in the length of time between phase alternations in the monitored signal.

Figure 2:
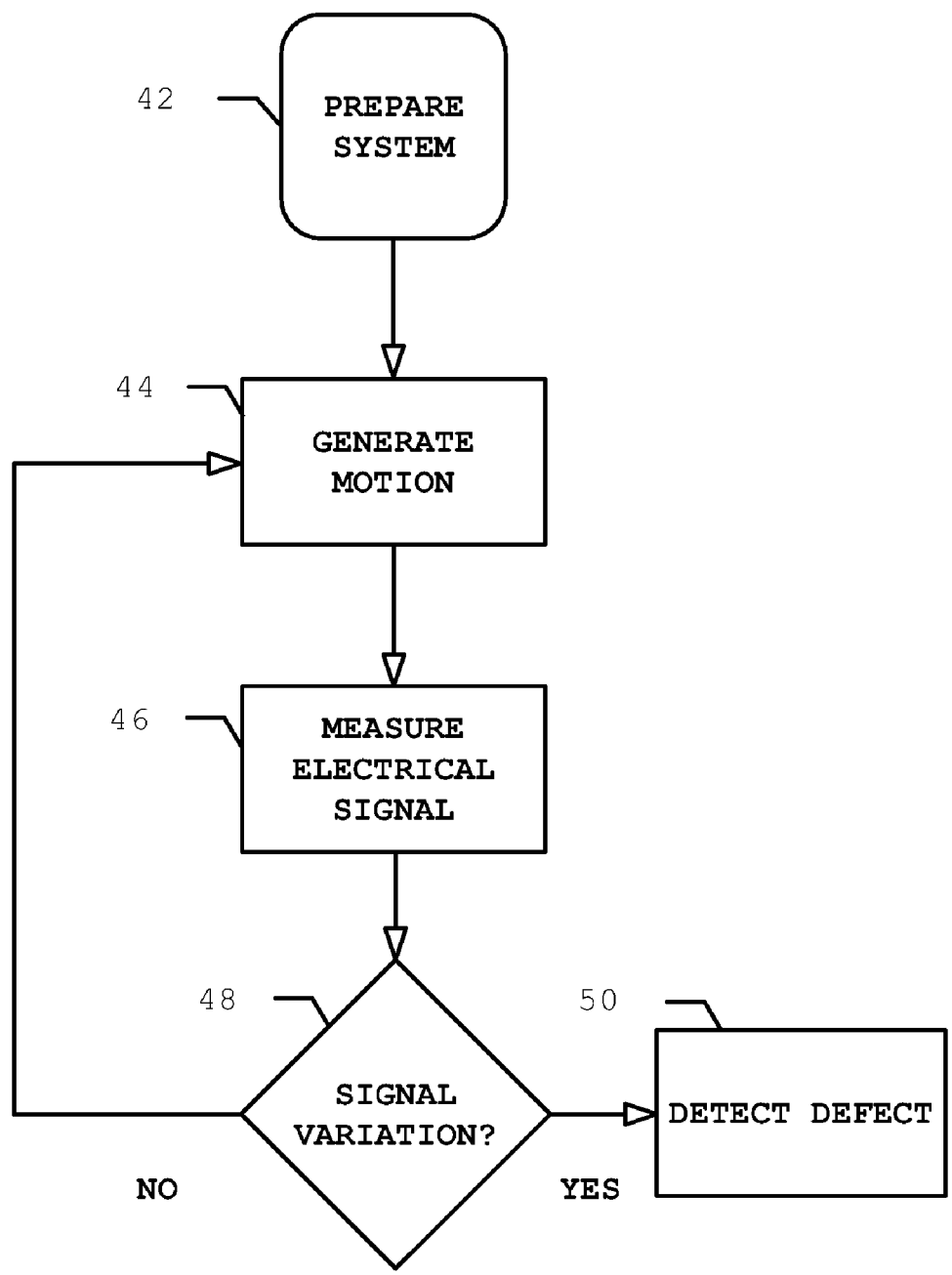
FIG. 2 is a flow chart that schematically illustrates a method for inspecting twisted-pair electrical cable, in accordance with an embodiment of the present invention.

Reference is now made to FIG. 2, which is a flow chart that schematically illustrates a method for inspecting twisted-pair electrical cable, in accordance with an embodiment of the present invention. In a system preparation step 44, twisted-pair wires 62 and 64 are shorted at trailing end 56 of twisted-pair electrical cable 22. (In a cable containing multiple twisted pairs, each pair of wires may be shorted and tested in the manner described herein.) Leading end 58 of twisted-pair electrical cable 22 is connected to amplifier 34, as described hereinabove. In the present embodiment, for example, twisted-pair electrical cable 22 comprises multiple wires that are 40 µm in diameter, and have 15 full twists per inch. Shield 38 comprises a helix of ten parallel strands of silver-plated copper that are 20 µm in diameter and covers more than 90% of the surface of twisted-pair electrical cable 22, and is coated with a finish comprising a polyurethane jacket. It will be understood, however, that operation of embodiments of the present invention is not limited to a particular type of twisted-pair electrical cable, that any other suitable twisted-pair electrical cable may be tested, and that all such cable is considered to be within the scope of embodiments of the present invention.

System preparation step 44 also comprises generation of the magnetic field in magnetic field focus 26 by activation of power generator 30 to produce a magnetic field focus 26 as described hereinabove. For sensitive detection of defects in the cable, magnetic field focus 26 in the gap of torus 24 should be smaller than an effective area of each half-twist of twisted-pair electrical cable 22. The effective area of each half twist of twisted-pair electrical cable 22 may be approximated using the following equation:

$$E_A = \frac{L*D}{4}, \qquad (1)$$

where $E_A$ is the effective area, L is the length of one complete twist, and D is the diameter of a single strand of twisted-pair electrical cable 22 including its insulation. It is desirable that the focus of the magnetic field have a size on the order of this area. Alternatively, a less focused magnetic field, or even a homogeneous field, could be used for testing the cable.

Amplifier 34 is typically designed in conjunction with the calculated pick-up voltage from twisted-pair electrical cable 22, which is a function of the size of the cable and the magnetic flux density and frequency in the gap in torus 24. In the present embodiment, wherein the magnetic flux density is 50 mA at 5 KHz excitation current in exciting coil 32, amplifier 34 is embodied as a low noise instrumental amplifier with a gain of approximately 2000.

In embodiments wherein monitor 36 comprises an oscilloscope for monitoring amplifier 34, system preparation step 44 may also comprise synchronizing the oscilloscope with magnetic field generator 30. Once synchronized, the oscilloscope should display a sine wave that varies in phase between the values −180° and +180° as twisted-pair electrical cable 22 moves through magnetic field focus 26. In the present example, there are approximately 30 phase alternations per inch of twisted-pair electrical cable 22 since each inch of cable is comprised of 15 full twists, and there should be two complete phase changes in each full twist of cable.

Relative motion is generated between twisted-pair electrical cable 22 and magnetic field focus 26 in a motion generation step 46. Twisted-pair electrical cable 22 may be moved by the conveyance device relative to magnetic field focus 26 or may be moved manually, as described hereinabove.

Measuring occurs in an electrical signal measuring step 48. In the present example, an oscilloscope is monitored to determine the electrical signal induced between the wires in twisted-pair electrical cable 22. If monitor 36 senses a variation in the electrical signal in a signal variation decision step 50, a defect is detected in a defect detection step 52. If the electrical signal varies, according to an application-specific criterion, as the cable is conveyed through the magnetic field, monitor 36 detects this variation, which is thereupon interpreted as a defect of twisted-pair electrical cable 22. If the electrical signal remains steady, whereby no signal variations are detected, as defined hereinabove, twisted-pair electrical wire 22 continues to move through magnetic field focus 26 in a resumption of motion generation step 46.

In some embodiments wherein data acquisition unit 54 is connected to monitor 36, data acquisition unit 54 may be synchronized to conveyor 27 of twisted-pair electrical cable 22, which may run automatically. Automatic conveyors that may be adapted for use in the present system are disclosed for example in U.S. Pat. No. 5,050,093 and U.S. Pat. No. 3,763,426, which are herein incorporated by reference.

In alternative embodiments, the principles of system 20 may be used to determine the precise locations of small magnetic coils that are encased in dielectric material, such as in a plastic casing. Such a system may also be used to locate hidden wire loops in electrical cable or other circuitry, in order to find and remove sources of electrical interference.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

What is claimed is:

1. A method of cable inspection, comprising:
generating a relative motion between a magnetic field and an electrical cable comprising a twisted pair of wires, wherein generating the relative motion comprises operating a magnetic field generator to produce the magnetic field, the magnetic field generator comprising a torus that defines a gap in which the magnetic field is concentrated, and wherein generating the relative motion further comprises moving at least one of the magnetic field generator and the electrical cable such that the electrical cable is translated longitudinally through the gap;
measuring an electrical signal induced in the wires responsively to the magnetic field;
sensing a variation in the electrical signal due to the relative motion; and
detecting a defect in the electrical cable responsively to the variation, wherein detecting the defect comprises identifying a defective part of the electrical cable due to the variation sensed when the defective part is in the gap.

2. The method according to claim 1 wherein detecting the defect comprises automatically identifying the defective part of the electrical cable by a data acquisition unit connected to a monitor.

3. The method according to claim 1 wherein moving the at least one of the magnetic field generator and the electrical cable comprises conveying the electrical cable through the gap.

4. The method according to claim 3 wherein conveying the electrical cable is performed manually.

5. An apparatus for cable inspection, comprising:
a magnetic field generator to produce a magnetic field, the magnetic field generator comprising a torus that defines a gap in which the magnetic field is concentrated;
a conveyor for generating a relative motion between the magnetic field and an electrical cable comprising a twisted pair of wires, the conveyor to generate the relative motion by moving at least one of the magnetic field generator and the electrical cable such that the electrical cable is translated longitudinally through the gap; and
a monitor coupled to the electrical cable, the monitor being configured to detect variations in electrical signals that are produced responsively to the relative motion, wherein the variations correspond to defects in the cable.

6. The apparatus according to claim 5, further comprising a data acquisition unit connected to the monitor that is configured to automatically identify a defective part of the electrical cable.

7. The apparatus according to claim 5, wherein the conveyor is arranged so as to convey the electrical cable through the gap.

* * * * *